United States Patent
Gasanov et al.

(10) Patent No.: US 6,637,016 B1
(45) Date of Patent: Oct. 21, 2003

(54) ASSIGNMENT OF CELL COORDINATES

(75) Inventors: Elyar E. Gasanov, Moscow (RU); Andrej A. Zolotykh, Moskovskaya Oblast (RU); Ivan Pavisic, San Jose, CA (US); Aiguo Lu, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 261 days.

(21) Appl. No.: 09/841,824

(22) Filed: Apr. 25, 2001

(51) Int. Cl.[7] ............................................. G06F 17/50
(52) U.S. Cl. ............................................. 716/12; 716/2
(58) Field of Search .............................. 716/2, 8, 9, 10, 716/12

(56) References Cited

U.S. PATENT DOCUMENTS 5,552,996 A * 9/1996 Hoffman et al. ........ 364/468.28
6,415,425 B1 * 7/2002 Chaudhary et al. ............ 716/9

* cited by examiner

Primary Examiner—Sara Crane
(74) Attorney, Agent, or Firm—Luedeka, Neely & Graham PC

(57) ABSTRACT

A method for selectively placing cells of an application-specific integrated circuit on a substrate surface, including the steps of defining a grid covering a substrate surface, assigning cells to the grid to provide old x and y coordinates of the cells relative to the grid, grouping the cells by function to provide functional regions within the grid, determining a density map of the surface of the substrate in all the functional regions within the grid, determining free space of the grid on the surface of the substrate relative to the density map, and assigning new cells to the free space of the grid on the substrate surface to provide an application specific integrated circuit. Use of the method provides improved layout of an integrated circuit with minimal cell congestion or overlapping.

13 Claims, 7 Drawing Sheets

ASSIGNMENT OF CELL COORDINATES

FIELD

The invention relates generally to the art of microelectronic integrated circuit layout, and more specifically to methods for substrate component placement to avoid overcrowding of a substrate surface.

BACKGROUND

Microelectronic integrated circuits consist of a large number of electronic components, including individual logic devices or groups of logic devices that are applied to the surface of a substrate, typically a silicon wafer. The components are typically grouped to provide an application-specific integrated circuit. For each application-specific integrated circuit, placement of the components in optimum positions provides efficient layout of the components on the substrate in order to reduce manufacturing costs, processor delays, size and the like. Because the application-specific integrated circuits typically contain hundreds of thousands, if not millions of components, the task of optimizing the placement of components on a substrate surface is not practical without the aid of computers.

Computer aided designs are effective to provide component location on the substrate surface for minimizing interconnection distances, wire sizes, processing times and the like. The smallest component placed on a substrate surface is defined as a "cell." A cell may be a single logic component of a larger logic tree or may be one or more logic trees. Assuming the number of cells N to be in the hundreds of thousands or millions, the number of different ways that the cells can be arranged on the substrate surface is equal to about N factorial. Selecting the optimum placement of the cells is therefore an extremely time consuming task.

Furthermore, despite the use of computer aided design techniques, algorithms used for selecting cell locations on the substrate surface may lead to cell congestion or overpopulation of cells in an area of the substrate surface. Overpopulation or overcrowding of an area of the substrate surface is undesirable from the standpoint of enabling efficient wiring routes, reducing overlapping circuits and the like. Accordingly, there continues to be a need for methods useful to further improve the cell placement on a substrate surface in order to lower substrate costs and increase processor speeds.

SUMMARY

With regard to the above and other objects and advantages, the invention provides a method for selectively placing cells of an application-specific integrated circuit on a substrate surface. The method includes the steps of:
a) defining a grid covering a substrate surface,
b) assigning cells to the grid to provide old x and y coordinates of the cells relative to the grid,
c) grouping the cells by function to provide functional regions within the grid,
d) determining a density map of the surface of the substrate in all the functional regions within the grid,
e) determining free space of the grid on the surface of the substrate relative to the density map, and
f) assigning new cells to the free space of the grid on the substrate surface to provide an application specific integrated circuit.

In another aspect the invention provides a method for reducing noise and congestion for substrate components on a substrate surface during a substrate component placement procedure for an application-specific integrated circuit. The method includes the steps of:
a) providing a grid covering the surface of the substrate defining old x and y coordinates of a cell and an old cell origin point for each cell to be placed on the substrate surface,
b) shifting all old cell origin points to a center of its corresponding cell,
c) flipping or rotating the cells to provide new cell origin points,
d) determining an approximate density map of the substrate surface based on the new cell origin points,
e) selecting new x and y cell coordinates of the cells at the new cell origin points,
f) optimizing the new x and y cell coordinates, and
g) determining an actual density map of the substrate surface based on the cell placement after optimization thereof.

In yet another aspect the invention provides a computing device for optimizing design of a semiconductor substrate layout. The computing device includes a memory for storing process steps including the steps of:
a) defining a grid covering a substrate surface,
b) assigning cells to the grid to provide old x and y coordinates of the cells relative to the grid,
c) grouping the cells by function to provide functional regions within the grid,
d) determining a density map of the surface of the substrate in all the functional regions within the grid,
e) determining free space of the grid on the surface of the substrate relative to the density map, and
f) assigning new cells to the free space of the grid on the substrate surface to provide an application specific integrated circuit In another aspect, the invention provides a physical media readable by a computerized system. The physical media includes a computer program for layout design and configuration of a semiconductor substrate, the program including the steps of:
a) defining a grid covering a substrate surface,
b) assigning cells to the grid to provide old x and y coordinates of the cells relative to the grid,
c) grouping the cells by function to provide functional regions within the grid,
d) determining a density map of the surface of the substrate in all the functional regions within the grid,
e) determining free space of the grid on the surface of the substrate relative to the density map, and
f) assigning new cells to the free space of the grid on the substrate surface to provide an application specific integrated circuit.

An important advantage of the invention is that it provides a semiconductor substrate layout having minimal cell congestion or overlapping thereby improving the utilization of the substrate surface more effectively.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
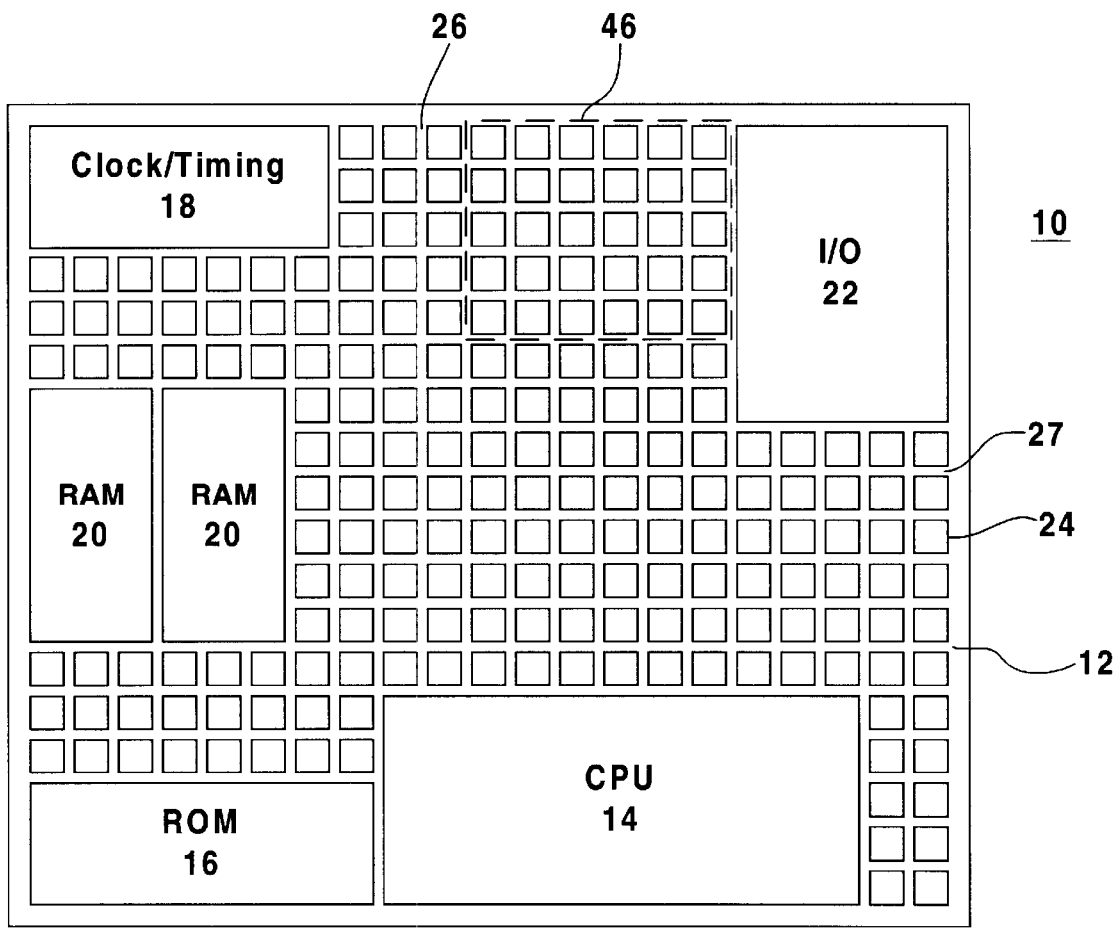
FIG. 1 is a plan view of a surface of a semiconductor substrate illustrating the placement of devices on a substrate surface.

Referring now to FIG. 1 there is shown an integrated circuit substrate 10 provided by a semiconductor substrate 12, such as a silicon substrate, having a plurality of components thereon. The components of the substrate are preferably made by layering various materials on the substrate 12 in deposit and etch cycles. The arrangement of the components on the substrate 12 is described in terms of a geometric description referred to as a layout, characterized by a plurality of planar geometric shapes separated from one another and arranged in layers on the substrate 12. Masks or patterns corresponding to the layout are used to render desired shapes at desired locations on the wafer in a series of photolithographic steps.

For example, the substrate 10 includes a plurality of functional circuit blocks formed thereon. These circuit blocks may include a central processing unit (CPU) 14, read-only memory (ROM) 16, clock/timing unit 18, random access memory (RAM) 20, and input/output interface (I/O) 22. The circuit substrate 10 preferably includes numerous (e.g., from about 10,000 to several million) cells 24. The cells 24 and the other components of the substrate 10 more specifically described above are interconnected or routed according to a desired logical design of the substrate corresponding to a desired application. The routing or interconnection between the cells is accomplished by electrically conductive lines or traces formed during the photolithographic steps and located in vertical channels 26 and horizontal channels 27 between the cells 24.

Each cell 24 corresponds to a logic element, such as a gate, or to a combination of logic elements interconnected to perform a specific function. For example, and with reference to FIG. 2, there is shown a logic tree 28 defined by a plurality of logic cells 30. Each logic cell 30 is preferably one of the cells 24 having an output pin provided by a standard logic gate. With reference to FIGS. 3a–3f, there are shown, respectively, examples of standard logic gates such as AND gate 30a, NAND gate 30b, NOT gate 30c, OR gate 30d, NOR gate 30e, and XOR gate 30f.

Figure 2:
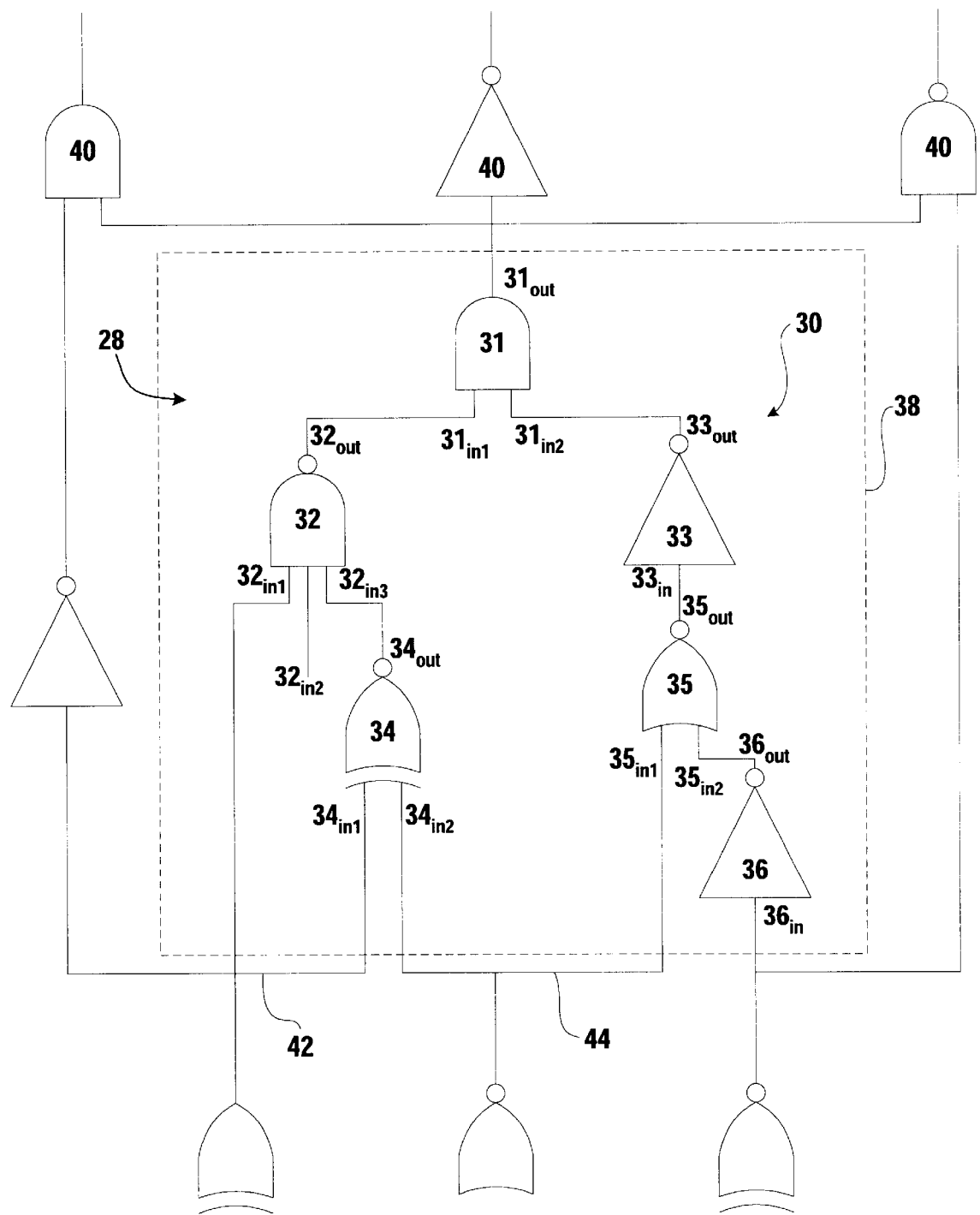
FIG. 2 is a diagrammatic view of a logic tree containing cells or logic gates.
Figure 3A:
FIGS. 3a–3f are diagrammatic views of logic gates for use in logic trees according to the invention.
Figure 3B:
Figure 3C:
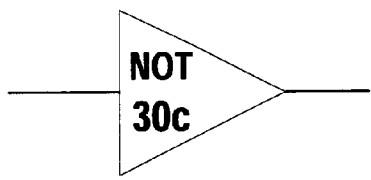
Figure 3D:
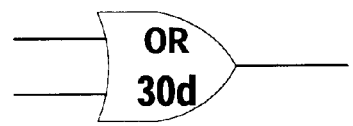
Figure 3E:
Figure 3F:

As an example, and with additional reference to FIG. 2, logic tree 28 includes six cells 31–36 located within an imaginary rectangle 38 indicated in dashed lines. Each of the cells 31–36 preferably has a single output pin, designated $31_{out}$–$36_{out}$, respectively. Each of the cells 31–36 also has one or more input pins. For example, cell 31 has input pins $31_{in1}$ and $31_{in2}$. Cell 32 has input pins $32_{in1}$, $32_{in2}$, and $32_{in3}$. In the same manner, cell 33–36 respectively have input pins $33_{in}$, $34_{in1}$, $34_{in2}$, $35_{in1}$, $35_{in2}$, and $36_{in}$.

The output pins of the cells 32–36 each preferably connect to a single input pin, namely an input pin of another of the cells 31–33 and 35. The output pin of the cell 31 does not connect to any input pin of any of the cells within the tree 28. Because of this, the cell 31 is referred to as the root of the logic tree 28. The output pin of the root cell 31 can be connected with any number of input pin cells, such as the input pins of cells such as cells 40, located outside of the rectangle 38. The input pins $32_{in1}$, $34_{in1}$, $35_{in1}$, and $36_{in}$ are connected with cells located outside of the tree 28 and are referred to as entrances to the tree. The input values of the entrances connected with a wire are preferably identical to one another. That is, pins $32_{in1}$ and $34_{in1}$ are connected by wire 42 and have the same input value, and the pins $34_{in2}$ and $35_{in1}$ are connected by wire 44 and have the same input value.

In the design of integrated circuits, it is desired to optimize placement of the cells in accordance with various design considerations. This may be done by determining an optimal arrangement of the cells in a plane and configuring an efficient routing scheme that achieves a desired functionality. The location of each cell on the substrate 10 is defined by its coordinates. The coordinates of a cell and the substrate boundaries are preferably referred to in terms of rectangular coordinates, such as $(x_i, y_i)$, where i=1, 2, . . . n. However, it will be understood that coordinates can be defined in other ways, such as in terms of polar coordinates.

In attempting to optimize the placement of the cells, an initial layout or set of cell coordinates may be provided using known techniques. This may be done for the entire integrated circuit, including all of its components, as by processing under a placement algorithm, such as described in commonly assigned U.S. Pat. No. 5,859,782, entitled Efficient Multiprocessing for Cell Placement of Integrated Circuits, the entire disclosure of which is incorporated herein by reference. Alternatively, as also described in U.S. Pat. No. 5,858,782, a subset or sub-area 46, such as depicted in FIG. 1 may be processed.

Figure 4:
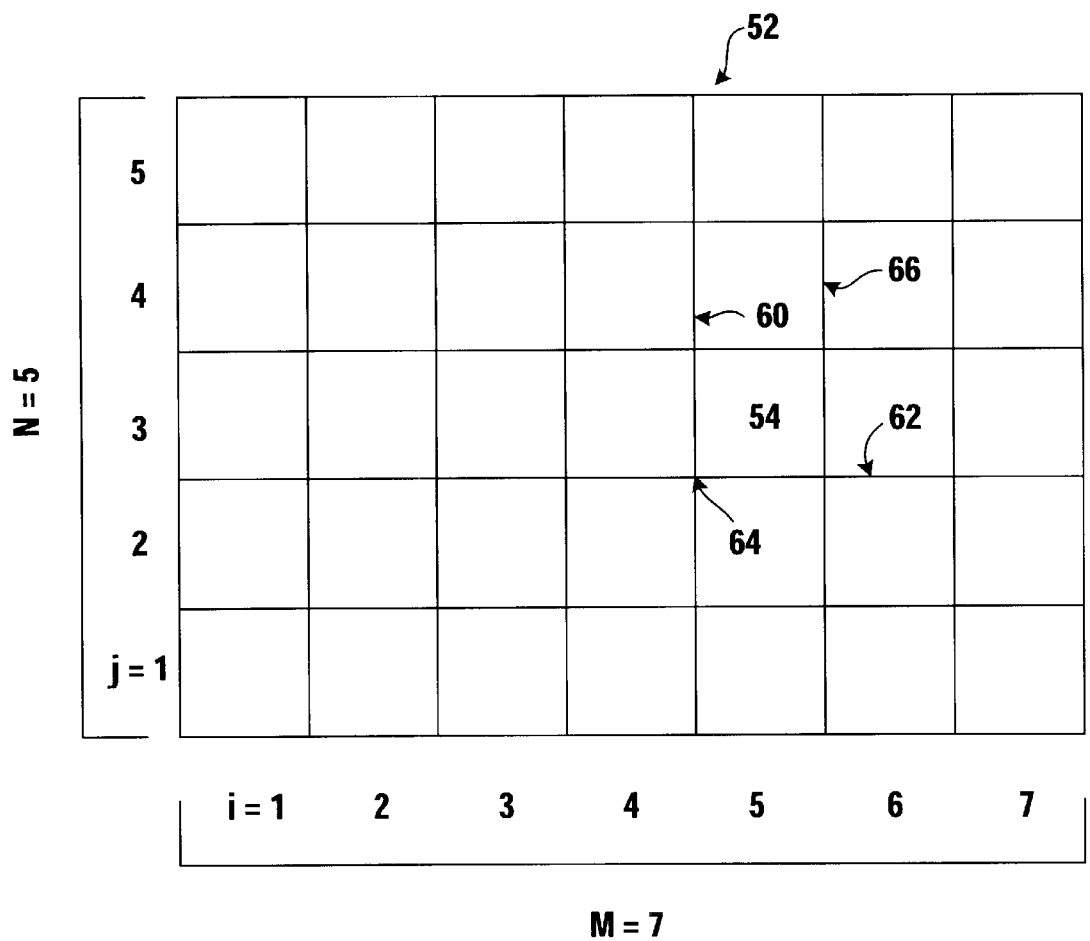
FIG. 4 is a representation of a grid or lattice on a semiconductor substrate surface used for assigning cell coordinates according to the invention.

Assignment of initial cell coordinates after placement of cells 24 on a substrate surface is preferably provided by a grid or lattice 52 as shown in FIG. 4. The lattice has five rows designated rows j=1, 2, 3, 4 and seven columns designated i=1, 2, 3, 4, 5, 6, 7. Accordingly $cell_{35}$ is in row j=3 and column i=5 indicated by reference numeral 54. The initial cell coordinates assigned to the cells by lattice 52 are preferably also called the old cell coordinates.

The area of the substrate 12 to be processed is preferably further divided into regions defined by distinct logic trees, and the coordinates of the logic trees determined. In the context of this invention, such initial logic trees are referred to herein as old or input logic trees. The coordinates of all cells connected with the output pin of the root cell of the tree, for example cell 31 as depicted in FIG. 2, and the coordinates of the tree entrances, or in other words the input pins $32_{in1}$, $34_{in1}$, $35_{in1}$, and $36_{in}$, also depicted in FIG. 2, define the logic tree coordinates.

Each old logic tree is preferably reconstructed into a new logic tree, preferably using iterative optimization processes known as resynthesis. Resynthesis may be carried out using multiple computers to perform iterative applications of desired optimization algorithms. A particularly preferred method for optimizing a logic tree is described in commonly assigned U.S. patent application Ser. No. 09/678,478, filed Oct. 2, 2000, and entitled Method and Apparatus for Dynamic Buffer and Inverter Tree Optimization, the entire disclosure of which is incorporated herein by reference.

As described in more detail below, once the cells 24 are assigned to the initial or old cell coordinates, the initial overall density matrix and free space of the substrate is determined without rearranging or reassigning coordinates to the old cells 24. Next, a new cell is assigned to the substrate surface based on the location of the free space and the density matrix of substrate. After initial assignment of the new cell to the substrate surface, the location of the new cell is optimized so that the substrate surface is not overcrowded, or in other words so that the cells are not congested. The procedures for assigning cells to a lattice, determining the density matrix and free space of the substrate and placing a new cell on the substrate surface are set forth below with reference to FIG. 5.

The purpose of the present invention is to optimize the placement of the individual cells on a substrate 12 in a manner which takes into account the relative positions or density of the cells within the lattice or grid 52, such that undesirable crowding of cells on the surface of the substrate is avoided. In one aspect, this is achieved by maintaining desirable cell density characteristics within a functional area or region on the substrate 12. That is, the cells are arranged according to the invention taking into consideration the free space available on the substrate surface between adjacent cells so that overcrowding of cells is avoided. Cell overcrowding is undesirable and can cause overflow problems, wherein conflicts between traces and adjacent cells can arise. A function of the invention therefore is to assign coordinates to each cell corresponding to its optimized location on the substrate surface.

Figure 5:
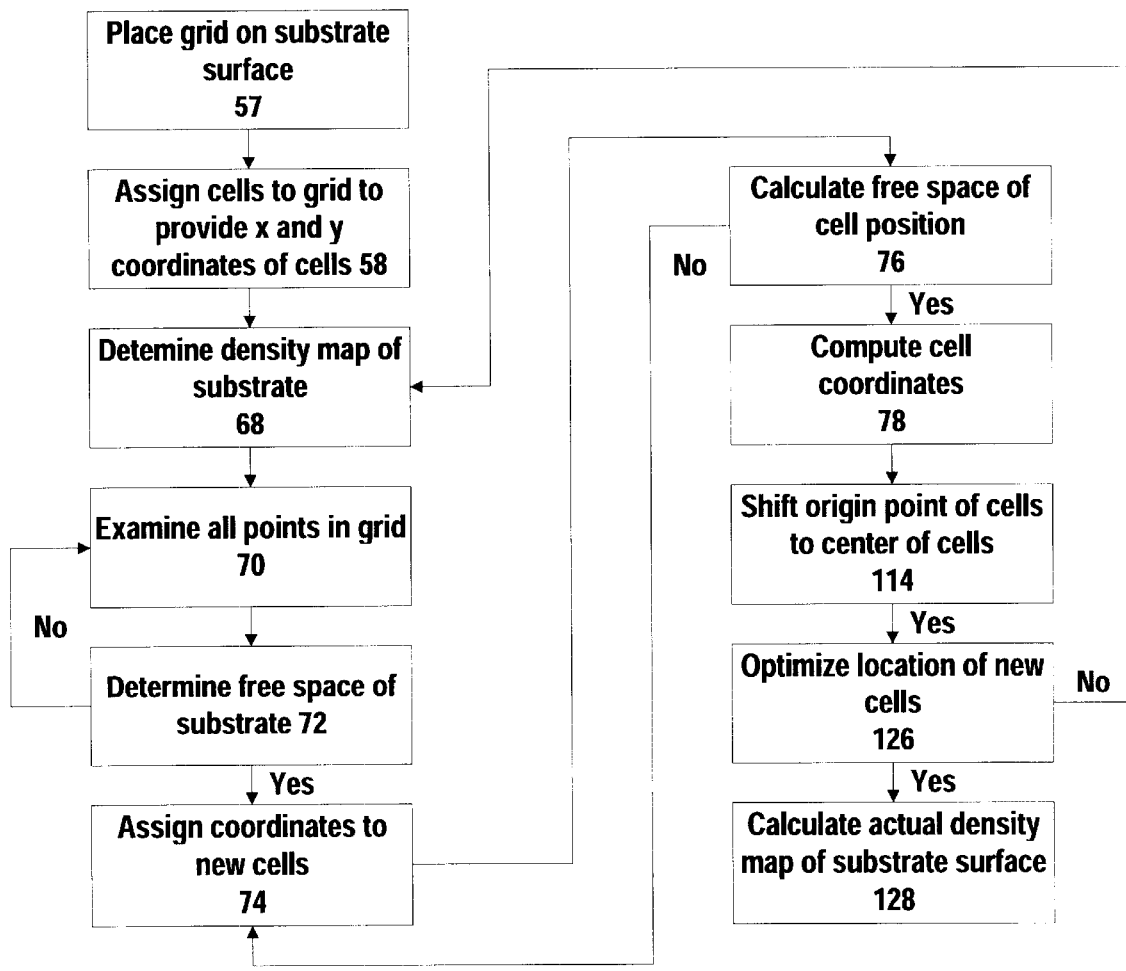
FIG. 5 is a block flow diagram for a substrate design procedure according to the invention.

A flow diagram 56 for a procedure used to optimize cell placement based on density matrix considerations is given in FIG. 5. As an initial step, indicated by 58 in the flow diagram, a grid 52 or plurality of grids 52 (FIG. 4) having vertical grid lines such as line 60 and horizontal grid lines such as line 62 is placed on the surface of the substrate 12 to define the initial x and y cell coordinates of a cell designated $(x_i, y_j)$ where j=0, 1, 2, . . . , n where n is the row number of the last row in the grid 52 and i=0, 1, 2, . . . m, where m is the column number of the last column in the grid 52. Each row has a height equal to the height of the ordinal cells and the width of a row of cells is equal to the width of the substrate 10. An ordinal cell such as cell 54 is a cell having coordinates x and y on the surface of the substrate 10.

The number of rows of the lattice is equal to the number of rows of cells on the substrate 12 and is denoted by RowNumber. The coordinates of the cells are equal to the x and y coordinates of the center-lines of the corresponding rows and columns in the lattice 52. RowCoordinate(j) is the y coordinate of the j-th row of the lattice 52 where j=0, 1, . . . , RowNumber−1. The origin point for a cell is selected as one of the points where the grid lines of the lattice intersect, usually the lower left hand corner of the corresponding row and column where the cell is placed. The origin point 64 of cell 54 is the point where the grid lines 60 and 62 intersect.

Assignment of Approximate Cell Coordinates

The number of columns of the lattice 52 is equal to the number of columns of cells on the substrate 12 and is denoted by ColumnNumber. ColumnCoordinate(i) is the x coordinate of the i-th column of the lattice where i=0, 1, . . . . ColumnNumber−1. $X_{min}, Y_{min}, X_{max}, Y_{max}$ are the coordinates of the substrate 10 outline. Using the foregoing definitions, the following matrix parameters are defined:

RowBoundary(0)=$Y_{min}$

RowBoundary(j)=RowCoordinate (j−1)+RowCoordinate (j)/2 for j=1, . . . , RowNumber−1

RowBoundary(RowNumber)=$Y_{max}$

Substrate Width=$X_{max}-X_{min}$ and

SubstrateHeight=$Y_{max}-Y_{min}$

The number of columns in lattice 52 is defined by:

ColumnNumber=RowNumber*Substrate Width/SubstrateHeight

If the height of the substrate is equal to the width of the substrate then the number of the columns in the lattice 52 is equal to the number of the rows in the lattice. ColumnWidth=SubstrateWidth/ColumnNumber. Accordingly, the coordinates of the columns may be computed using the following formulas:

ColumnCoordinate(0)=$X_{min}$+ColumnWidth/2

ColumnCoordinate(i)=ColumnCoordinate(i−1)+ColumnWidth+1 for i=1, . . . , SubstrateWidth ÷ ColumnNumber−1,

ColumnCoordinate(i)=ColumnCoordinate(i−1)+Column Width for i=SubstrateWidth ÷ ColumnNumber, . . . , ColumnNumber−1 where SubstrateWidth ÷ ColumnNumber means Substrate Width modulo ColumnNumber

ColumnBoundary(0)=$X_{min}$

ColumnBoundary(i)=ColumnCoordinate(i−1)+ColumnCoordinate[i]/2 for i=1, . . . , ColumnNumber−1, and

ColumnBoundary(ColumnNumber)=$X_{max}$.

If X is the x coordinate of some vertical grid and ColumnBoundary(i)<X≦ColumnBoundary(i+1), then this grid belongs to the i-th column. If Y is the y coordinate of some horizontal grid and RowBoundary(j) <Y≦RowBoundary (j+1), then this grid belongs to the j-th row.

Within the lattice 52, the surface of the substrate 10 may have some blockages or regions which cannot be used for new cell placement. For example, new cells 24 which do not perform a defined function for one of the functional areas of the substrate designated by 14, 16, 18, 20 and 22 in FIG. 1 cannot be placed in one of these functional areas of the substrate since these areas are reserved for cells which perform the specified function. Each substrate 10 has regions where the functional devices 14, 16, 18, 20 and 22 are placed creating areas which or not available for new cells which do not perform the specified functions. If FunctionNumber is the number of the substrate function, a matrix of the functional regions is provided as follows:

FunctionRegion(FunctionNumber)(ColumnNumber) (RowNumber).

If a cell having coordinates (ColumnCoordinate(i), RowCoordinate(j)) belongs to the k-th functional region then: FunctionRegion(k)(i)y)=1, otherwise FunctionRegion (k)(i)(j)=0. If a cell having coordinates (ColumnCoordinate (i), RowCoordinate(j)) belongs to some blockage then FunctionRegion(k)(i)(j)=0 for all k=0, 1, . . . , FunctionNumber −1.

In addition to the blockage and functional areas, a substrate 10 may also contain gray boxes. A gray box is defined as a region on the substrate 12 where only buffers or inverters may be placed. A cell is defined as a repeater if it contains a buffer or inverter. Accordingly, if the substrate has gray boxes, then the matrix GrayBox(ColumnNumber) (RowNumber) is provided. If a cell having coordinates (ColumnCoordinate(i), RowCoordinate(j)) belongs to a gray box then GrayBox(i)(j)=1, otherwise GrayBox(i)(j)=0

Each row has a specific characteristic called an angle. An angle can be equal to 0 or 180. The angles of all cells belonging to a particular row must be equal to the angle of the row. The substrate 10 may also have dual height cells. A dual height cell can be placed only in two neighboring rows, if their outlines have a common horizontal side and the first of these rows has the angles 180 and the second row angle is equal to 0. If the substrate has dual height cells then the array DualChar(RowNumber) is created. If the j-th row angle is equal to 180, then the (j+1)-th row angle is equal to 0 and its outlines have a common horizontal side and DualChar(j)=1. If the j-th row angle equals 0, the (j−1)-th row angle equals 180 and its outlines have a common horizontal side and DualChar(j)=2. Otherwise DualChar(j)=0.

Within the grid 52, a vertical grid line such as line 60 (FIG. 4) has an x coordinate X which belongs to the i-th column and the j-th row if this grid line 60 belongs to the i-th column and the interval $\{(X,y)|\text{Rowboundary}(j)<y\leq\text{RowBoundary}(j+1)\}$ does not intersect a blockage. The matrix GridsNumber(ColumnNumber)(RowNumber) is provided where GridsNumber(i)(j) is the number of the vertical grid line 60 which belongs to the i-th column and the j-th row. Furthermore, if $\text{Cell}_{xmin}$ and $\text{Cell}_{xmax}$ are the x coordinates of the outline of some cell and $D_{vert}$ is the distance between neighboring vertical grid lines such as lines 60 and 62 (FIG. 4), then the value $(\text{Cell}_{xmax}-\text{Cell}_{xmin})/D_{vert}$ is the width of the cell.

A cell belongs to some region if the cell's coordinates belong to the region. Accordingly, a cell belonging to the i-th column and the j-th row also belongs to the region.

$\{(x,y)|\text{ColumnBoundary}(i)<x\leq\text{ColumnBoundary}(i+1)$ and RowBoundary (j)$<y\leq$RowBoundary (j+1)$\}$

Free Space in the Grid Determination

After initially assigning cells 24 to the grid 52 in step 58 (FIG. 5), a density map of the substrate is determined in step 68 providing matrix FreeGrids(ColumnNumber) (RowNumber) wherein FreeGrids(i)(j)=GridsNumber(i)(j)−SumWidth(i)(j), where SumWidth(i)(j) is the total width of all cells belonging to the i-th column and the j-th row. The matrix FreeGrids reflects the density map of the substrate.

Next, all points in the grid are examined in step 70 and the size and free space of each row of the grid 52 is determined in step 72 in order to provide the available or free space in adjacent cells in a row on the surface of the substrate 10. This procedure provides a group of cells in adjacent columns which are available for new cell placement. The group of cells is denoted as the GroupNumber which is defined by the following formula GroupNumber=(ColumnNumber)$^{1/2}$ where GroupNumber is an integer and
GroupCardinality=ColumnNumber/GroupNumber.
Accordingly, the matrix
FreeGridsInGroup(GroupNumber)(RowNumber)
is the free space in the group of cells in neighboring columns may be calculated by the following formula:

$$FreeGridsInGroup[i][j] = \sum_{k=(i-1)*GroupCardinality}^{i*GroupCardinality-1} FreeGrids(k)(j)$$

The array FreeGridsInRow describes the free space in the groups of cells in the neighboring columns placed in the same rows and provides the free space of each row of the grid 52.

The array FreeGridsInRow(RowNumber) is provided by the following formula:

$$FreeGridsInRow[j] = \sum_{i=0}^{ColumnNumber-1} FreeGrids[i][j]$$

New Cell Placement Using FreeSpace

Once the grid 52 and the free FreeSpace matrix on the surface of the substrate 10 is defined, a new cell may be assigned in step 74 to some position in the grid. In order to determine if the cell 24 will fit the assigned position, the size of the cell 24 and the amount of free space of the assigned position must be determined. If x and y are the coordinates of the selected position, n is the cell function number and RepeaterFlag is a flag which is equal to 1 if the cell is a repeater cell. Dual/lag is a flag which is equal to 1 if the cell has a dual height. The following procedure signified as step 76 is used to calculate the free space of a cell position. If there is no free space in a cell position, the procedure sets the free space to 0, otherwise, the quantity of free space is provided.

Assume cell having the coordinates x and y belongs to the i-th column and the j-th row. If the coordinates of the cell do not belong to the n-th function region, or in other words if (FunctionRegion(Function)(i)(j)=0), or RepeaterFlag=0 and GrayBox(i)(j)=1, or DualFlag=1 and DualChar(j)=0 then the cell position is not available for placement of the new cell and the procedure sets the free space to 0. Otherwise, the following formulas are used to calculate the free space according to the procedure:

FreeSpace=$\alpha_{-2}$*FreeGrids(i−2)(j)+$\alpha_{-1}$*FreeGrids(i−1)(j)+FreeGrids(i)(j)+$\alpha_{1}$*FreeGrids(i+1)(j)+$\alpha_{2}$*FreeGrids(i+2)(j)

Where the coefficient k of $\alpha_k$ is equal to −2, −1, 1, and 2 such that $0 \leq \alpha_k \leq 1$ and $\alpha_k=0$ if i+k<0 or i=k$\geq$ColumnNumber, or FunctionRegion(n)(i+k)(j)=0, or RepeaterFlag=0 and GrayBox (i+k)(j)=1. In all other cases $\alpha_{-2}=\alpha_{-1}=\alpha_1=\alpha_2=1$.

Furthermore if FreeSpace<FreeGridsInGroup(i/GroupCardinality)(j) then FreeSpace=FreeGridsInGroup(i/GroupCardinality)(j) taking into account the congestion of the group of cells in the particular column. In order to set the location of the new cells using various resynthesis procedures, corresponding copies of the FreeGrids, FreeGridsInGroup and FreeGridsInRow arrays are used instead of using the actual arrays determined above. For DualFlag=1, the FreeSpace' for the i-th column and the j'-th row is calculated as set forth above where j'=j+1 if DualChar(j)=1 and j'=j−1 if DualChar(j)=2. Accordingly, FreeSpace=min (FreeSpace, FreeSpace'). The foregoing procedure for determining the FreeSpace may be used to resize a cell or in other resynthesis procedures and cell or tree placement optimization procedures.

Computation of Approximate New Cell Coordinates

In order to compute the approximate new cell coordinates in step 78 for a new cell 24 placed on the substrate the coordinates of the pins connected to the cell 24 are determined. For example, the set $\{(x_i, y_i)|i=1, 2, \ldots, n\}$ is the coordinates of the pins connected to the cell 24. The coordinates of the cell 24 may then be calculated by the mass center method or the median method. For the mass center method, the coordinates of the cell are defined by the following:

$$\left(\frac{1}{n}\sum_{i=1}^{n} x_i, \frac{1}{n}\sum_{j=1}^{n} y_i\right)$$

For the median method, the set or coordinates are sorted so that sets $\{(x|i=1, 2, \ldots, n \text{ and } y_j|j=1, 2, \ldots n\}$ are provided. The coordinates of the cells are assigned as $(x_{n/2}, y_{n/2})$. The mass center method is typically used for a low or medium effort level and the median method is typically used for a high effort level, or in other words a number of computational iterations before the desired result is achieved.

Figure 6:
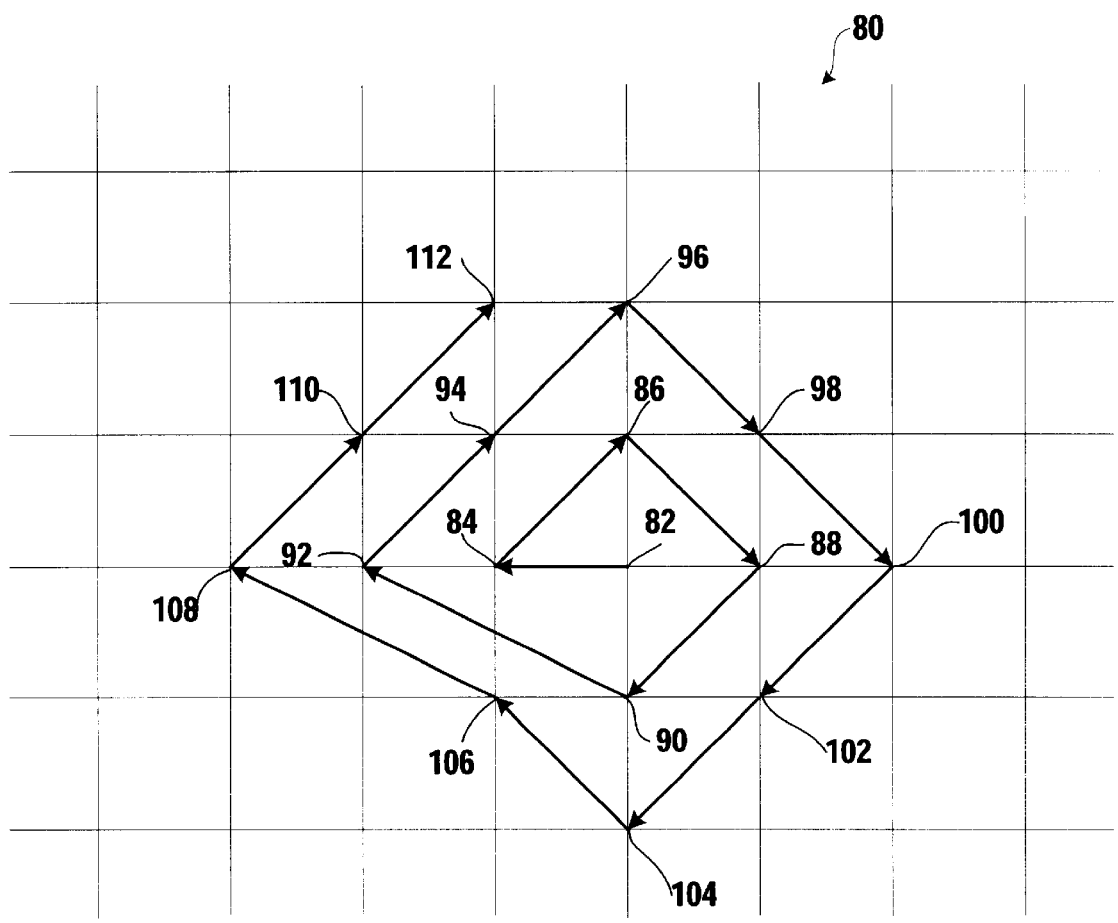
FIG. 6 is a schematic representation of one of the steps of a cell location selection procedure according to the invention.

The procedure for examining all points in a grid 80 is conducted according to step 70 after assigning a new cell to the grid 80 so that the origin point 82 (FIG. 6) of the cell has coordinates which are determined as described above. The coordinates of the origin point 82 are (x,y) such that the point 82 (x,y) belongs to the i-th column and the j-th row. All points in the grid adjacent the origin point 82 of the new cell are examined beginning at the origin point 82 and moving in an outwardly spiraling pattern as shown in FIG. 6 to points 84 through 112. For each point 84–112, the free space of each position defined by a the points 84 through 112 is determined as described above. If there is enough free space in the grid 80 to place the cell at origin point 82, then the procedure returns the coordinates of the origin point 82 for the new cell 24 according to step 74 of the procedure described above.

Figure 7A:
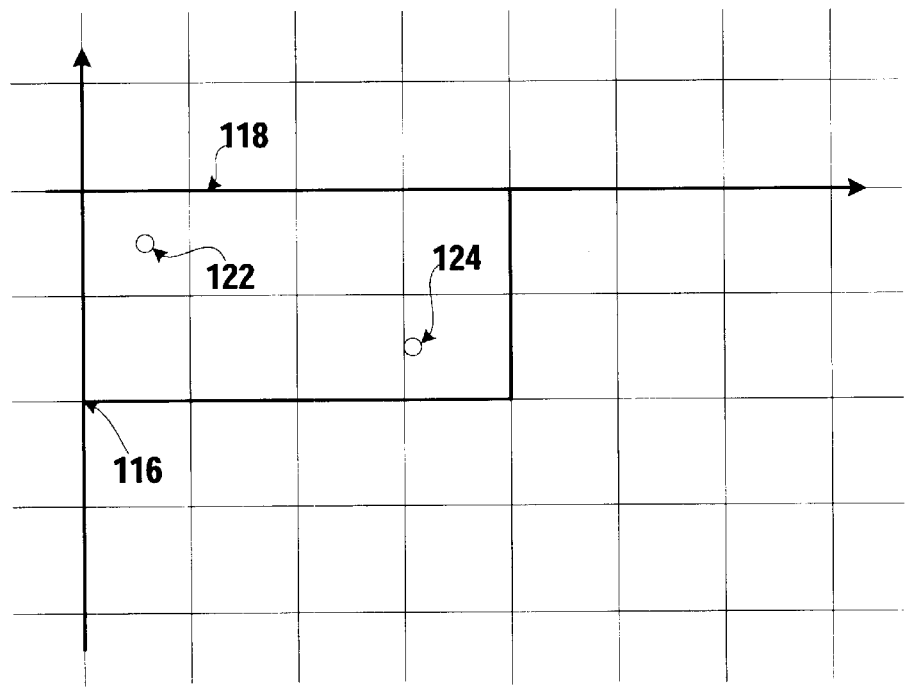
FIGS. 7A and 7B are schematic representations of another step of a cell location selection procedure according to the invention.
Figure 7B:
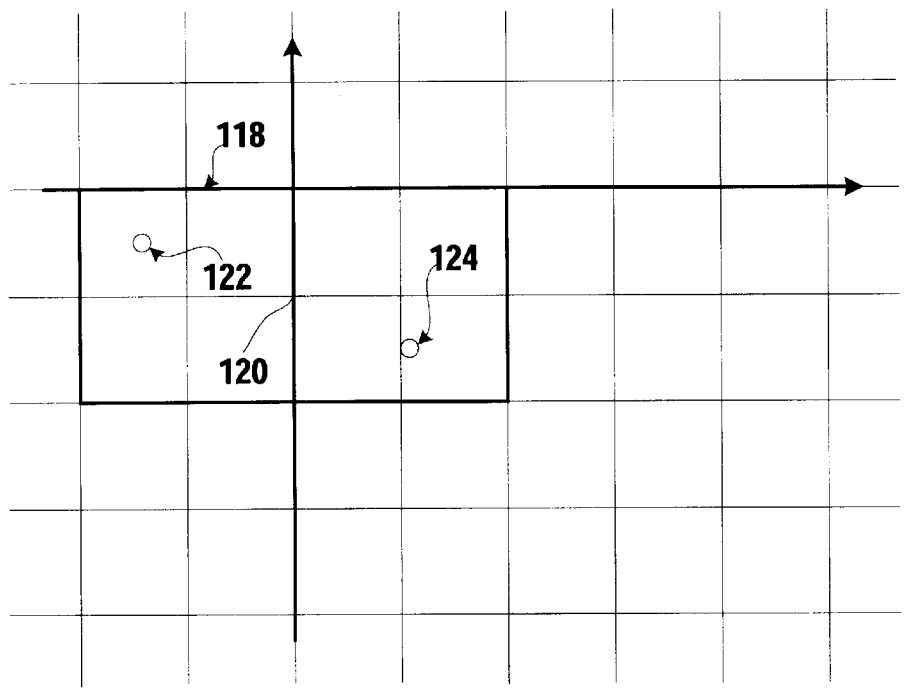

Placement of a new cell placed on the substrate 12 requires that the definition or cell type of the cell be provided. The cell type contains the cell outline and the approximate new cell coordinates or pin coordinates defined above. All coordinates are considered relative to the origin point of a cell which is usually located in one of the corners of the cell where grid lines cross. In step 114 of the procedure 56, the old origin point 116 of all cell types such as cell type 118 is shifted to the center of the cell as shown in FIGS. 7A and 7B to a new origin point 120 wherein numerals 122 and 124 are the pins of cell type 118. Shifting the origin point 116 to new origin point 120 effectively shifts the coordinates of the pins 122 and 124 of cell type 118. Some of the cell types may also be rotated or flipped relative to their original origin point. Nevertheless, only the coordinates of the pins such as pins 122 and 124 are changed by such shifting, rotating or flipping the cell type 118 while the relative location of the cell type 118 with respect to the grid remains substantially unchanged. The coordinates of cell type 118 become the coordinates of the origin point 120 of the cell type 118 rather than the coordinates of origin point 114.

At this point various resynthesis procedures may be used to optimize the location of cell type 118 in step 126 and thereby effectively change the density map of the substrate 10. If a resizing procedure is used, the type of a specified cell type may be changed. Before the type of the specified cell type is changed, the FreeSpace of neighboring or adjacent cell positions is determined as set forth above. The entries of the FreeGrids matrix and the FunctionRegion matrix determined above are used to provide the width of the new cell type denoted as SpecifiedCellWidth. If the calculated FreeSpace <0 then only cell types of the width not more than the SpecifiedCellWidth may be used, otherwise, cell types of a width not more than SpecifiedCellWidth+FreeSpace are used.

If a new cell type is created by another resynthesis method, the mass center of the pins connected to the cell type is determined as set forth above and the cell type is assigned coordinates close to the mass center of the cell type where there is little congestion. A suitable procedure for assigning coordinates where there is minimal congestion is described above with reference to FIG. 6.

In another resynthesis procedure, an old logic tree is replaced by a new logic tree. In this case, coordinates of all cell types are assigned based on the location of the new logic tree. In this case, only the coordinates of the all cell types connected to the output pin of the new logic tree root and the coordinates of the input pins to the new logic tree are known. All cell types in the new logic tree are examined, item by item beginning with the input pins to the new logic tree. The coordinates of the cell types are set as the coordinates of the mass center of the pins connected to the cell types. The procedure is repeated until all of the coordinates of all the cell types in the new logic tree are changed. When the coordinates of the cell types in the new logic tree remain substantially unchanged after a number of iterations, usually ten to twenty or more iterations, the approximate coordinates of all cell types in the new logic tree are determined so that the optimized location of the cell types on the substrate 10 is provided.

The actual coordinates of the cell types can be found by combining the procedure described above with reference to FIG. 6 and the resynthesis procedure for assigning cell types to a new logic tree and selecting the resulting coordinates and optimizing the selection of the new cell type coordinates. After modifying the substrate 10 by inserting the new cell types, each cell type in the lattice is examined in an attempt to increase the elements in the FreeGrids matrix. After optimizing cell type locations by examining the cell types individually, the corresponding elements in the Free-Grids matrix is decreased if possible. The resulting Free-Grids matrix is provided as a result of the foregoing procedure and provides a substrate having the desired density optimization. The actual density map of the substrate surface is provided in step 128 of the procedure.

The procedure described above is preferably conducted using a computing device containing a memory and a processor sufficient to manipulate data generated by the procedure in order to optimize the result and calculate the actual density map of the substrate in step 126. The procedure is adaptable to storage in a computer memory or on a physical media readable by a computerized system. A computer program may thus be configured with logical elements which are adapted to perform the steps of the procedures set forth above in order to provide an optimized layout for cells on a substrate 10.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for selectively placing cells of an application-specific integrated circuit on a substrate surface comprising the steps of:

a) defining a grid covering a substrate surface, b) assigning cells to the grid to provide old x and y coordinates of the cells relative to the grid, c) grouping the cells by function to provide functional regions within the grid, d) determining a density map of the surface of the substrate in all the functional regions within the grid, e) determining free space of the grid on the surface of the substrate relative to the density map, and f) assigning new cells to the free space of the grid on the substrate surface to provide an application specific integrated circuit, by i) assigning an origin point in the free space on the grid to a new cell ii) inspecting the origin point to determine if enough free space exists at the origin point to place the new cell, and iii) when there is not enough free space at the origin point to place the new cell, then inspecting adjacent points on the grid in an outwardly spiraling pattern until a point on the grid within the free space is located at which the new cell will fit.

2. The method of claim 1 further comprising determining cell blockages prior to grouping cells by function.

3. The method of claim 1 further comprising optimizing the assignment of new cells on the substrate surface.

4. A method for reducing noise and congestion for substrate components on a substrate surface during a substrate component placement procedure for an application-specific integrated circuit, the method comprising the steps of:

a) providing a grid covering the surface of the substrate defining old x and y coordinates of a cell and an old cell origin point for each cell to be placed on the substrate surface, b) shifting all old cell origin points to a center of its corresponding cell, c) flipping or rotating the cells to provide new cell origin points, d) determining an approximate density map of the substrate surface based on the new cell origin points, e) selecting new x and y cell coordinates of the cells at the new cell origin points, f) optimizing the new x and y cell coordinates, and g) determining an actual density map of the substrate surface based on the cell placement after optimization thereof.

5. The method of claim 4 further comprising providing an actual density matrix on the substrate surface after optimizing the now x and y cell coordinates.

6. The method of claim 4 further comprising providing regions within the grid and determining the noise and congestion of the regions prior to defining the old x and y cell coordinates of the substrate components.

7. The method of claim 4 further comprising selecting cell components for placement on a substrate based on cell types of the cells.

8. A computing device for optimizing design of a semiconductor substrate layout comprising:

a memory for storing process steps including the steps of, a) defining a grid covering a substrate surface, b) assigning cells to the grid to provide old x and y coordinates of the cells relative to the grid, c) grouping the cells by function to provide functional regions within the grid, d) determining a density map of the surface of the substrate in all the functional regions within the grid, e) determining free space of the grid on the surface of the substrate relative to the density map, and f) assigning new cells to the free space of the grid on the substrate surface to provide an application specific integrated circuit, by i) assigning an origin point in the free space on the grid to a new cell, ii) inspecting the origin point to determine if enough free space exists at the origin point to place the new cell, and iii) when there is not enough free space at the origin point to place the new cell, then inspecting adjacent points on the grid in an outwardly spiraling pattern until a point on the grid within the free space is located at which the new cell will fit, and a processor for manipulating data provided for the process steps in order to define an optimum substrate layout based substrate density considerations.

9. The computing device of claim 8 wherein the process steps include determining cell blockages prior to grouping cells by function.

10. The computing device of claim 8 the process steps further include optimizing the assignment of new cells on the substrate surface.

11. A physical media readable by a computerized system comprising a computer program for layout design and configuration of a semiconductor substrate, the program including the steps of:

a) defining a grid covering a substrate surface, b) assigning cells to the grid to provide old x and y coordinates of the cells relative to the grid, c) grouping the cells by function to provide functional regions within the grid, d) determining a density map of the surface of the substrate in all the functional regions within the grid, e) determining free space of the grid on the surface of the substrate relative to the density map, and f) assigning new cells to the free space of the grid on the substrate surface to provide an application specific integrated circuit, by i) assigning an origin point in the free space on the grid to a new cell, ii) inspecting the origin point to determine if enough free space exists at the origin point to place the new cell, and iii) when there is not enough free space at the origin point to place the new cell, then inspecting adjacent points on the grid in an outwardly spiraling pattern until a point on the grid within the free space is located at which the new cell will fit.

12. The physical media of claim 11 wherein the program step include determining cell blockages prior to grouping cells by function.

13. The physical media of claim 11 wherein the program steps further include optimizing the assignment of new cells on the substrate surface.

* * * * *